(12) United States Patent
Forrest et al.

(10) Patent No.: US 10,680,132 B2
(45) Date of Patent: Jun. 9, 2020

(54) NON-DESTRUCTIVE WAFER RECYCLING FOR EPITAXIAL LIFT-OFF THIN-FILM DEVICE USING A SUPERLATTICE EPITAXIAL LAYER

(71) Applicant: The Regents of the University of Michigan, Ann Arbor, MI (US)

(72) Inventors: Stephen R. Forrest, Ann Arbor, MI (US); Kyusang Lee, Ann Arbor, MI (US); Dejiu Fan, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 90 days.

(21) Appl. No.: 15/111,218

(22) PCT Filed: Jan. 15, 2015

(86) PCT No.: PCT/US2015/011550
§ 371 (c)(1),
(2) Date: Jul. 13, 2016

(87) PCT Pub. No.: WO2015/156871
PCT Pub. Date: Oct. 15, 2015

(65) Prior Publication Data
US 2016/0351747 A1    Dec. 1, 2016

Related U.S. Application Data

(60) Provisional application No. 61/927,928, filed on Jan. 15, 2014.

(51) Int. Cl.
*H01L 31/00* (2006.01)
*H01L 31/18* (2006.01)
(Continued)

(52) U.S. Cl.
CPC .... *H01L 31/1896* (2013.01); *H01L 31/03046* (2013.01); *H01L 31/035236* (2013.01);
(Continued)

(58) Field of Classification Search
CPC .................................................. H01L 31/1896
See application file for complete search history.

(56) References Cited

U.S. PATENT DOCUMENTS 5,757,835 A    5/1998  Ono et al.
2007/0277874 A1*  12/2007  Dawson-Elli ....... H01L 31/0687
                                                                136/256
(Continued)

OTHER PUBLICATIONS

Klein et al., "Selective InAs/GaSb strained layer superlattice etch stop layers for GaSb substrate removal," Appl. Phys. A 111, 671-674 (2012) (Year: 2012).*

(Continued)

*Primary Examiner* — Angelo Trivisonno
(74) *Attorney, Agent, or Firm* — Finnegan, Henderson, Farabow, Garrett & Dunner, LLP

(57) ABSTRACT

The present disclosure relates to methods and growth structures for making thin-film electronic and optoelectronic devices, such as flexible photovoltaic devices, using epitaxial lift-off (ELO). In particular, disclosed herein are wafer protection schemes that preserve the integrity of the wafer surface during ELO and increase the number of times that the wafer may be used for regrowth. The wafer protection schemes use growth structures that include at least one superlattice layer.

20 Claims, 10 Drawing Sheets

(51) Int. Cl.
*H01L 31/0304* (2006.01)
*H01L 31/0352* (2006.01)
*H01L 31/0687* (2012.01)
*H01L 31/0693* (2012.01)
*H01L 31/0735* (2012.01)

(52) U.S. Cl.
CPC ...... *H01L 31/0687* (2013.01); *H01L 31/0693* (2013.01); *H01L 31/0735* (2013.01); *H01L 31/1844* (2013.01); *H01L 31/1892* (2013.01); *Y02E 10/544* (2013.01); *Y02P 70/521* (2015.11)

(56) References Cited

U.S. PATENT DOCUMENTS

| | | | | |
|---|---|---|---|---|
| 2011/0186910 | A1* | 8/2011 | Forrest | H01L 21/7813 257/190 |
| 2012/0309172 | A1* | 12/2012 | Romano | H01L 21/2654 438/478 |
| 2013/0037095 | A1 | 2/2013 | Forrest et al. | |
| 2013/0043214 | A1 | 2/2013 | Forrest et al. | |
| 2013/0133730 | A1 | 5/2013 | Pan et al. | |

OTHER PUBLICATIONS

Vandenberg et al., "Structural perfection of InGaAs/InP strained-layer superlattices grown by gas source molecular-beam epitaxy: A high-resolution x-ray diffraction study," J. Appl. Phys. 66 (8) (1989) (Year: 1989).*

International Search Report & Written Opinion, PCT/US2015/011550, dated Oct. 19, 2015.

B. Klein et al., "Selective InAs/GaSb strained layer superlattice etch stop layers for GaSb substrate removal," Applied Physics vol. 111, No. 2, Sep. 29, 2012 pp. 671-674.

Shinohara M, "Dislocation-free GaaS Epitalxia Growth with the use of Modulation-Doped Alas-GaaS Superlattice Buffer Layers," Applied Physics Letters, American Institute of Physics, vol. 52, No. 7, Feb. 15, 1988, pp. 543-545.

S.M. Bedair et al., "Defect reduction in GaAs grown by molecular beam epitaxy using different supperlattice structures," Applied Physics Letters, vol. 49, No. 15, Oct. 13, 1986, pp. 942-944.

* cited by examiner

NON-DESTRUCTIVE WAFER RECYCLING FOR EPITAXIAL LIFT-OFF THIN-FILM DEVICE USING A SUPERLATTICE EPITAXIAL LAYER

CROSS-REFERENCE TO RELATED APPLICATION

This application claims the benefit of priority to U.S. Provisional Application No. 61/927,928, filed Jan. 15, 2014, which is incorporated herein by reference in its entirety.

STATEMENT REGARDING FEDERALLY SPONSORED RESEARCH

This invention was made with U.S. Government support under award numbers W911NF-13-1-0485 and W911NF-08-0004 awarded by the Army Research Office. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to methods and growth structures for making thin-film electronic and optoelectronic devices, such as flexible photovoltaic devices, using epitaxial lift-off (ELO). In particular, the disclosure relates to non-destructive wafer recycling for ELO processes.

Thin-film technologies, such as single-crystalline semiconductor-based devices, are desirable in the field of electronics due to their flexibility, light weight, and high performance characteristics. ELO is a technology in which a thin-film device region may be "lifted off" of a growth substrate or wafer and transferred to a host substrate. The device region is separated from the wafer by selectively etching a sacrificial layer. A key advantage of the ELO process is the potential for wafer reuse following lift-off of the device region, which can greatly reduce manufacturing costs by minimizing the consumption of expensive wafers.

Conventional ELO processes, however, result in significant wafer surface roughening and accumulation of contaminants. To eliminate these defects in preparation for subsequent epitaxial growth, a polishing etch process is typically used. Generally, however, this process does not provide a high quality regrowth interface, and thus device layers grown on a chemically polished surface after ELO lead to subsequently fabricated devices with dramatically reduced performance. Bauhuis, G. J. et al., "Wafer reuse for repated growth of III-V solar cells," *Prof. Photovolt.* 18, 155-159 (2010). Chemo-mechanical wafer repolishing is used to solve this problem, but such process consumes tens of microns of material from the top surface of the wafer, thereby limiting the potential number of wafer reuses.

Disclosed herein is a wafer protection scheme that preserves the integrity of the wafer surface during ELO and increases the number of wafer reuses, e.g., at least 50 reuses, using at least one superlattice layer, which bends dislocations and other defects toward the wafer edges.

In one embodiment of the present disclosure, a growth structure for ELO comprises a growth substrate, a protection layer above the growth substrate, a sacrificial layer above the protection layer, and an epilayer above the sacrificial layer, wherein the protection layer comprises at least one superlattice layer.

In another embodiment, there is disclosed a method of fabricating a growth structure for ELO, comprising depositing a protection layer over a growth substrate, depositing a sacrificial layer over the protection layer, and depositing an epilayer over the sacrificial layer, wherein the protection layer comprises at least one superlattice layer.

In another embodiment, there is disclosed a method of recycling a growth substrate comprising providing a growth structure comprising a growth substrate, a protection layer above the growth substrate, a sacrificial layer above the protection layer, and an epilayer above the sacrificial layer, wherein the protection layer comprises at least one superlattice layer; releasing the epilayer by etching the sacrificial layer; and removing the protection layer by etching the protection layer.

In another embodiment, there is disclosed a method of preserving the integrity of a device region during ELO, comprising providing a growth structure comprising a growth substrate, a sacrificial layer above the growth substrate, a protection layer above the sacrificial layer, and an epilayer above the protection layer, wherein the protection layer comprises at least one superlattice layer; releasing the epilayer by etching the sacrificial layer; and removing the protection layer from the epilayer by etching the protection layer. In some embodiments, as described herein, the protection layer further comprises one or more protective layers.

In another embodiment, there is disclosed a method of recycling a growth substrate, comprising: depositing a buffer layer over a growth substrate, depositing a protection layer over the buffer layer, depositing a sacrificial layer over the protection layer, depositing an epilayer over the sacrificial layer, releasing the epilayer by etching the sacrificial layer, removing the protection layer by etching the protection layer, performing at least one iteration of the above steps, and polishing the growth substrate to remove some or all of an accumulation of the buffer layer.

The foregoing and other features of the present disclosure will be more readily apparent from the following detailed description of exemplary embodiments, taken in conjunction with the attached figures. It will be noted that for convenience all illustrations of structures show the height dimension exaggerated in relation to the width.

The accompanying figures are incorporated in and constitute a part of this specification.

Figure 1:
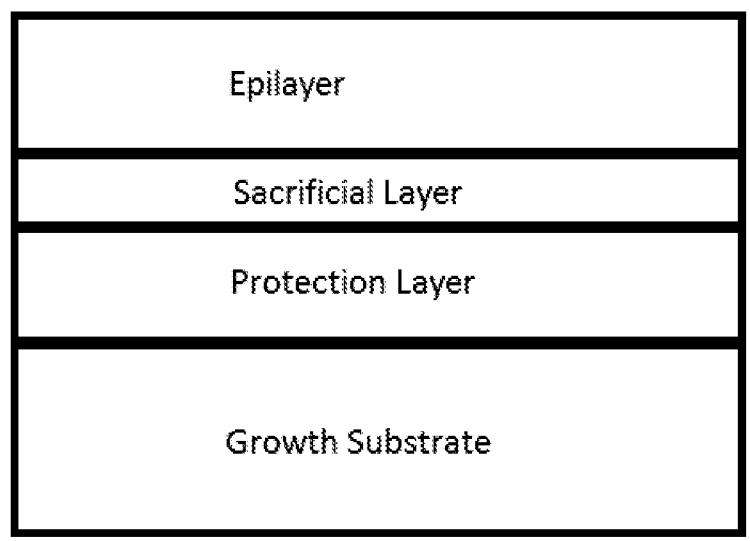
FIG. 1 shows an exemplary growth structure according to the present disclosure.

As used herein, the term "III-V material" may be used to refer to compound crystals containing elements from group IIIA and group VA of the periodic table. More specifically, the term "III-V material" may be used herein to refer to compounds which are combinations of the group of Gallium (Ga), Indium (In) and Aluminum (Al), and the group of Arsenic (As), Phosphorous (P), Nitrogen (N), and Antimony (Sb).

It should be noted that the III-V compounds herein are named in an abbreviated format. A two component material is considered to be in approximately a 1:1 molar ratio of group III:V compounds. In a three or more component system (e.g. InGaAlAsP), the sum of the group III species (i.e. In, Ga, and Al) is approximately 1 and the sum of the group V components (i.e. As, and P) is approximately 1, and thus the ratio of group III to group V is approximately unity.

Names of III-V compounds are assumed to be in the stoichiometric ratio needed to achieve lattice matching or lattice mismatching (strain), as inferred from the surrounding text. Additionally, names can be transposed to some degree. For example, AlGaAs and GaAlAs are the same material.

As used herein, the term "layer" refers to a member or component of a structure or device whose primary dimension is X-Y, i.e., along its length and width. It should be understood that the term "layer" is not necessarily limited to single layers or sheets of materials. A layer can comprise laminates or combinations of several sheets of materials.

When a first layer is described as disposed or deposited "over" or "above" a second layer, the first layer is positioned further away from the substrate than the second layer. The first layer may be disposed directly on the second layer, but unless it is specified that the first layer is disposed or deposited "on" or "in physical contact with" the second layer, there may be other layers between the first layer and the second layer. For example, an epilayer may be described as disposed "over" or "above" a sacrificial layer, even though there may be various layers in between. Similarly, a protection layer may be described as disposed "over" or "above" a growth substrate, even though there may be various layers in between. Similarly, when a first layer is described as disposed or deposited "between" a second layer and a third layer, there may be other layers between the first layer and the second layer, and/or the first layer and the third layer, unless it is specified that the first layer is disposed or deposited "on" or "in physical contact with" the second and/or third layers.

A "superlattice layer" is defined as a sequence of stacked layers in which a layer sequence that includes at least two non-identical layers repeats in a direction perpendicular to the interfaces between the layers, i.e., for example, in the growth direction of the layers. In this sense, a "superlattice layer," as used herein, is constituted by, for example, a sequence of alternately stacked non-identical layers of semiconductor materials, where "alternately" is to be understood as meaning that two or more layers succeed one another by turns. Examples of such superlattices are provided by the following layer sequences: "ab|ab|ab . . . ", "abc|abc|abc| . . . ", and "ababc|ababc|ababc . . . ", where a, b, and c represent non-identical layers of semiconductor materials, such as III-V materials. Each repeatable unit, e.g., "ab" using the first example above, is referred to herein as a "period." Thus, the superlattice layers described herein may comprise numerous periods.

As used herein, the terms "wafer" and "growth substrate" can be used interchangeably.

In one embodiment of the present disclosure, a growth structure for epitaxial lift-off comprises a growth substrate, a protection layer above the growth substrate, a sacrificial layer above the protection layer, and an epilayer above the sacrificial layer, wherein the protection layer comprises at least one superlattice layer.

FIG. 1 illustrates an exemplary growth structure having a growth substrate, a protection layer above the growth substrate, a sacrificial layer above the protection layer, and an epilayer above the sacrificial layer.

The growth substrate is a substrate having at least one growing surface. It may comprise any number of materials, including single-crystal wafer materials. In some embodiments, the growth substrate is a single-crystal wafer. In some embodiments, the growth substrate may comprise a material chosen from Ge, Si, GaAs, InP, GaP, GaN, GaSb, AlN, SiC, CdTe, sapphire, and combinations thereof. In certain embodiments, the growth substrate comprises GaAs. In other embodiments, the growth substrate comprises InP. In some embodiments, the materials comprising the growth substrate may be doped. Suitable dopants may include, but are not limited to, Zn, Mg (and other group IIA compounds), Cd, Hg, C, Si, Ge, Sn, O, S, Se, Te, Fe, and Cr. For example, the growth substrate may comprise InP doped with Zn and/or S. Unless otherwise indicated, it should be understood that reference to a layer comprising, e.g., InP, encompasses InP in its undoped and doped (e.g., p-InP, n-InP) forms. Suitable dopant selections may depend, for example, on the semi-insulating nature of a substrate, or any defects present therein.

Figure 2:
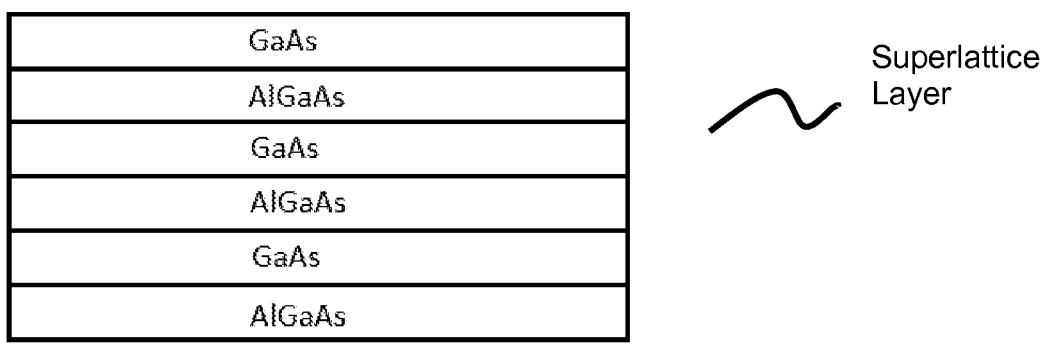
FIG. 2 shows a non-limiting example of a superlattice layer according to the present disclosure.

The protection layer protects the growth substrate during ELO. In some embodiments, the protection layer is disposed directly on the growing surface of the growth substrate. It may comprise at least one superlattice layer, an example of which is shown in FIG. 2 using the materials AlGaAs and GaAs. In some embodiments, the superlattice layer comprises III-V materials, such as, for example, arsenide- or phosphide-based materials. In some embodiments, the superlattice layer comprises II-VI materials. In certain embodiments, the III-V materials are chosen from GaAs, AlInP, GaInP, AlGaInP, AlGaAs, GaPSb, AlPSb, InP, InGaAs, InAlAs, InAs, InSb, GaP, AlP, GaSb, AlSb, GaAsSb, AlAsSb. Exemplary material combinations for the superlattice include, but are not limited to, AlGaAs/GaAs, AlGaAs/AlGaAs (with varying Al % composition), GaAsP/GaAs, InGaAs/GaAs, InGaP/GaAs, AlInP/InP, InGaAs/InP, InAlAs/InP, InAlAs/InGaAs, InAlAs/AlAs, InAs/InAsSb, and AlAs/GaAs/AlGaAs. The superlattice layer may be lattice matched or strained.

In some embodiments, each individual layer in the superlattice ranges has a thickness in a range from 0.5 nm to 300 nm, such as from 1 nm to 100 nm, from 1 nm to 50 nm, or from 2 nm to 25 nm. In some embodiments, the superlattice layer has a total thickness in a range from 2 nm to 2 μm.

In some embodiments, the superlattice layer has at least 2 periods, at least 5 periods, at least 10 periods, at least 25 periods, at least 40 periods, at least 50 periods, at least 100 periods, or any number of periods therebetween. In some embodiments, the superlattice layer has at least 5 but no more than 60 periods. In some embodiments, the superlattice layer has at least 25 but no more than 60 periods.

Figure 3A:
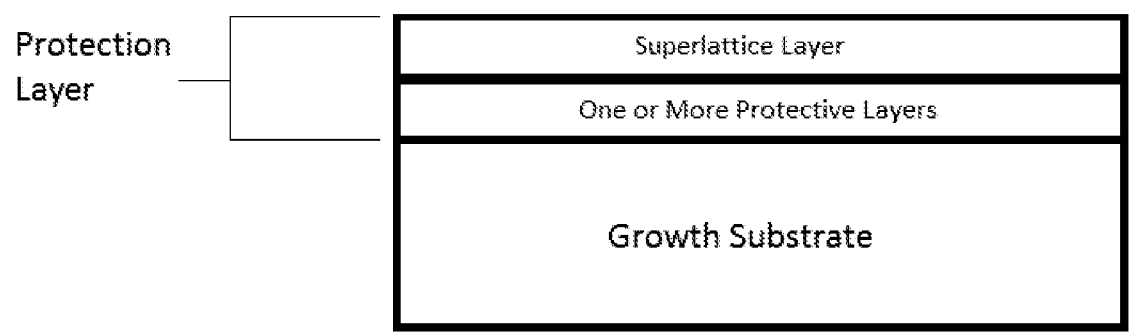
FIGS. 3A and 3B show examples of a wafer protection scheme.
Figure 4A:
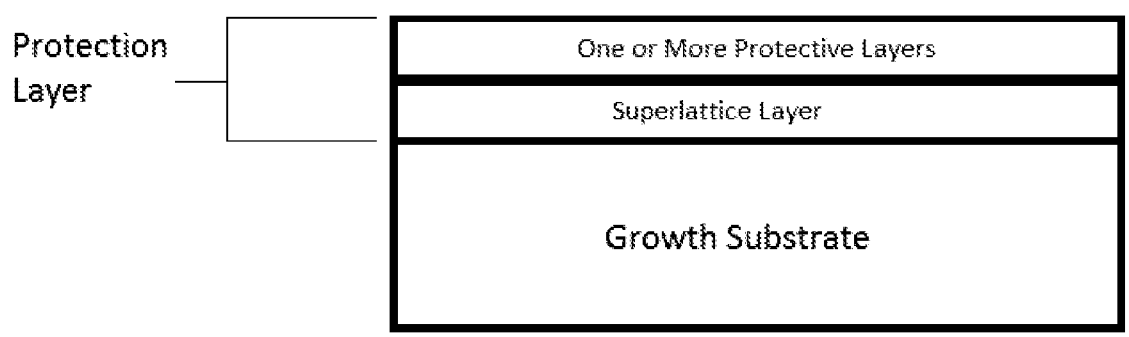
FIGS. 4A and 4B show examples of a wafer protection scheme.
Figure 4B:
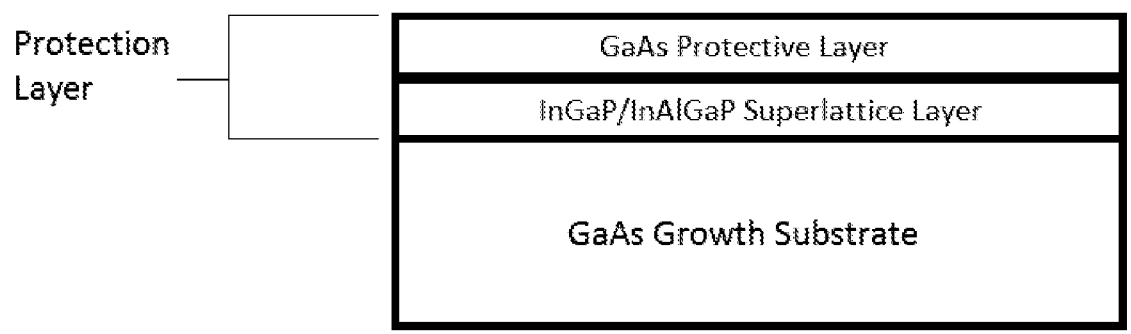
Figure 5A:
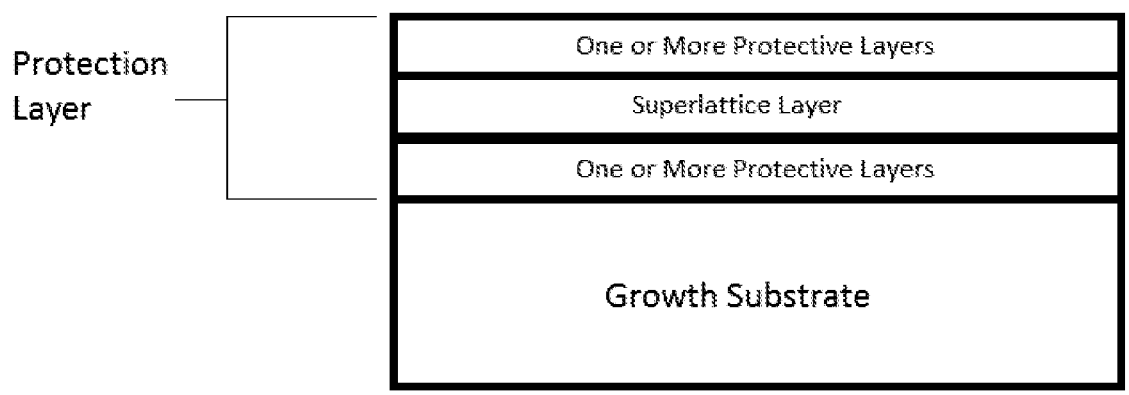
FIGS. 5A and 5B show examples of a wafer protection scheme.
Figure 5B:
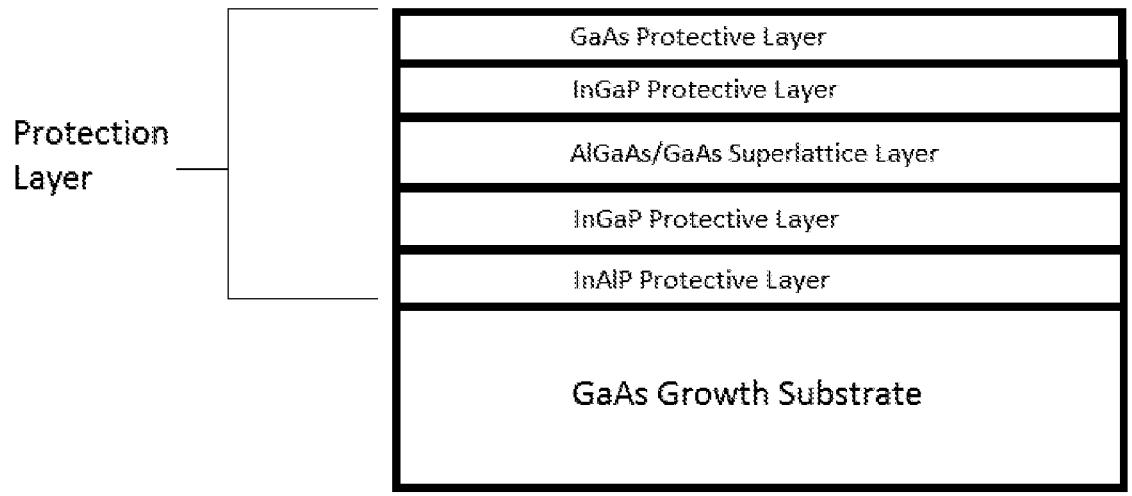

The protection layer may further comprise one or more protective layers. In some embodiments, the protection layer further comprises one protective layer. In other embodiments, the protection layer further comprises two protective layers. In other embodiments, the protection layer further comprises three or more protective layers. The protective layer(s) may be positioned between the growth substrate and the superlattice layer (FIG. 3A; exemplary scheme in FIG. 3B), between the superlattice layer and the sacrificial layer (FIG. 4A; exemplary scheme in FIG. 4B), or a combination thereof (FIG. 5A; exemplary scheme in FIG. 5B). In some embodiments, the one or more protective layers are independently chosen from III-V material, such as, for example, arsenside- and/or phosphide-based materials. The protective layers may be lattice-matched or strained. At least one protective layer may be lattice matched while at least another protective layer may be strained. The thickness of a strained layer should be thinner than its critical thickness.

Examples of suitable III-V materials for the one or more protective layers include, but are not limited to, AlInP, GaInP, AlGaAs, GaPSb, AlPSb, InP, InGaAs, InAs, InSb, GaP, AlP, GaSb, AlSb, InAlAs, GaAsSb, AlAsSb, and GaAs. In some embodiments, when the growth substrate is GaAs, the one or more protective layers are chosen from lattice matched AlInP, GaInP, AlGaAs, GaPSb, AlPSb, and strained InP, InGaAs, AlInP, GaInP, InAs, InSb, GaP, AlP, GaSb, AlSb. In some embodiments, when the growth substrate is InP, the one or more protective layers are chosen from lattice matched InGaAs, InAlAs, GaAsSb, AlAsSb, and strained InGaAs, InAlAs, GaAsSb, AlAsSb, InAs, GaSb, AlSb, GaAs, GaP and AlP.

U.S. Pat. No. 8,378,385 and U.S. Patent Publication No. 2013/0043214 are incorporated herein by reference for their disclosure of protective layer schemes. Unlike those disclosures, however, the present disclosure includes a superlattice layer as described herein. Thus, it should be understood that the presently described superlattice layer may be added to the protective layer schemes, or may replace at least one of the existing protective layers, disclosed in U.S. Pat. No. 8,378,385 and U.S. Patent Publication No. 2013/0043214.

Figure 3B:
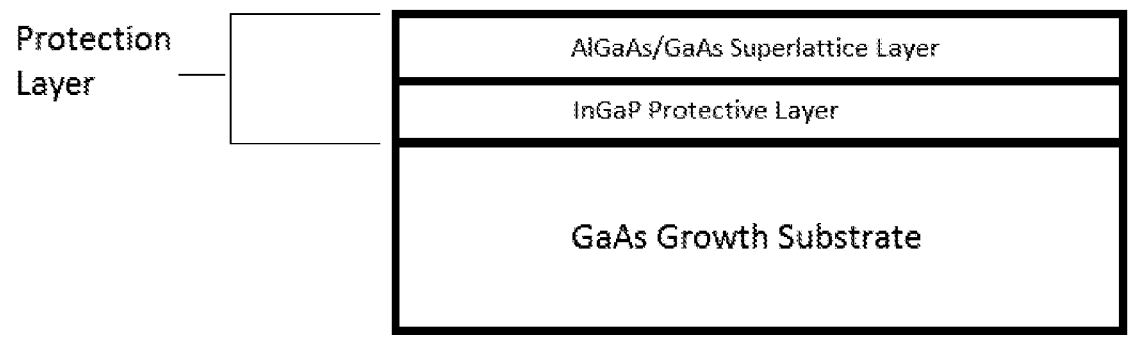

In certain embodiments of the present disclosure, the growth substrate comprises GaAs and the superlattice layer is chosen from the following material combinations: AlGaAs/GaAs, GaAsP/GaAs, InGaAs/GaAs, AlGaAs/AlGaAs (with varying Al % composition), InGaP/InAlGaP, InAlGaP/GaAs, and InGaP/GaAs. Examples are shown in FIGS. 3B, 4B and 5B.

In certain embodiments, the superlattice layer comprises at least 2 periods, at least 5 periods, at least 10 periods, at least 25 periods, at least 40 periods, at least 50 periods, at least 100 periods, or any number of periods therebetween of AlGaAs/GaAs. In further of these embodiments, the growth substrate is GaAs. In certain embodiments, the Al composition in one or more, or in certain embodiments in each, AlGaAs layer ranges from about 1% to about 100%, i.e., from about $Al_{0.01}Ga_{0.99}As$/GaAs to about $Al_{0.99}Ga_{0.01}As$/GaAs, such as, for example, from about $Al_{0.10}Ga_{0.90}As$/GaAs to about $Al_{0.80}Ga_{0.20}As$/GaAs, from about $Al_{0.15}Ga_{0.85}As$/GaAs to about $Al_{0.60}Ga_{0.40}As$/GaAs, or from about $Al_{0.20}Ga_{0.80}As$/GaAs to about $Al_{0.40}Ga_{0.60}As$/GaAs. In certain embodiments, the superlattice comprises at least 5 but no more than 60 periods of $Al_{0.3}Ga_{0.7}As$/GaAs.

Figure 6:
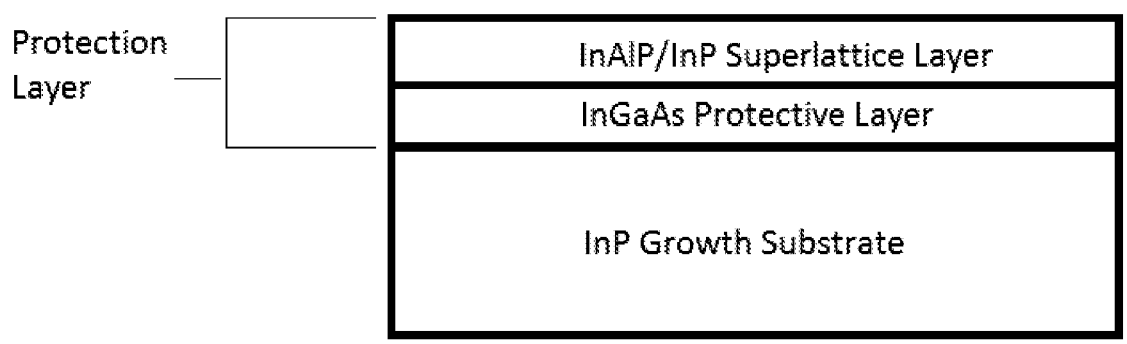
FIG. 6 shows an example of a wafer protection scheme.

In certain embodiments, the growth substrate comprises InP and the superlattice layer is chosen from the following material combinations: InGaAs/InP, AlInP/InP, InAlAs/InP, InAlAs/AlAs. An example is shown in FIG. 6.

The at least one superlattice layer and the protective layer(s) described herein protect the growth substrate during ELO. The protective layer positioned nearest the growth substrate should have a high etch selectivity relative to the growth substrate such that the protective layer nearest the growth substrate can be removed via an etchant that stops abruptly on the growth substrate or that stops abruptly on a growth substrate buffer layer should the growth substrate have a buffer layer. The principle holds true for the superlattice layer in embodiments where the superlattice layer is positioned closer to the growth substrate than the one or more protective layers.

As used herein the term "etch selectivity" refers to the rate at which a particular etchant removes a particular material when compared to the rate of etching of another material. Etch selectivity of X and Y is quantified as the ratio between the etching rate of X to the etching rate of Y for a particular etchant. Accordingly, "highly selective," as used herein, refers to etch selectivities where one material is etched rapidly while the other is etched very slowly or not etched at all, such as greater than 10:1, greater than $10^2$:1, greater than $10^3$:1, $10^4$:1, greater than $10^5$:1, greater than $10^6$:1, or even greater than $10^7$:1.

An exemplary protection layer scheme is shown in FIG. 3B, where the growth substrate comprises GaAs and the protection layer comprises an AlGaAs/GaAs superlattice layer and an InGaP protective layer. After performing ELO, the superlattice layer may be removed by etching, followed by removal via etching of the InGaP protective layer, which has a high etch selectivity with the GaAs growth substrate. Generally, the superlattice layer is etched all at once, though it is possible to etch layer-by-layer. In the exemplary protection layer scheme shown in FIG. 3B, the GaAs/AlGaAs superlattice layer may be etched with a phosphoric acid-based etchant.

The superlattice layer has the advantage of bending dislocations and other defects toward the wafer edges, hence removing them along with the superlattice layer during the protection layer etching process. Using the example directly above and without being bound by any particular theory, the bending of dislocations and other defects toward the wafer edges is because the critical stress of AlGaAs for dislocation threading is larger than that of GaAs, causing hardly any threading of dislocations in AlGaAs. Within the superlattice structure, the GaAs layer is subjected to tensile stress larger than its critical stress, while the AlGaAs layer is subjected to locally compressive stress not larger than its critical stress. Consequently, the dislocation in GaAs is blocked at the superlattice and bent along the interface plane. Due to the crystal hardening from the Al component in GaAs, the larger the AlAs content of the AlGaAs layer, the thicker the AlGaAs layer, or the larger the number of layers employed, the larger the degree of dislocation density reduction. In addition, the superlattice does not bring about deterioration of crystalline quality and no new dislocation is generated in the superlattice.

The sacrificial layer of the growth structure acts as a release layer during ELO for releasing the epilayer from the growth substrate. The sacrificial layer may be chosen to have a high etch selectivity relative to the epilayer and/or the growth substrate so as to minimize or eliminate the potential to damage the epilayer and/or growth substrate during ELO. In some embodiments, the sacrificial layer comprises a III-V material. In some embodiments, the III-V material is chosen from AlAs, Al InP, and AlGaInP. In certain embodiments, the sacrificial layer comprises AlAs. In some embodiments, the sacrificial layer has a thickness in a range from about 2 nm to about 200 nm, such as from about 4 nm to about 100 nm, from about 4 nm to about 80 nm, or from about 4 nm to about 25 nm.

In some embodiments, the sacrificial layer is a superlattice sacrificial layer. Non-limiting examples of the superlattice sacrificial layer include AlAs/AlGaAs, AlAs/GaAs, AlGaAs/GaAs, and InAlAs/AlAs. In certain embodiments, the growth substrate comprises GaAs and the superlattice sacrificial layer comprises AlAs/AlGaAs, AlAs/GaAs, or AlGaAs/GaAs. In certain embodiments, the growth substrate comprises InP and the superlattice sacrificial layer comprises InAlAs/AlAs.

The epilayer of the growth structure refers any number of layers desired to be "lifted off" of the growth substrate. The epilayer, for example, may comprise any number of active semiconductor layers for fabricating an electronic or optoelectronic device. Thus, the epilayer is sometimes referred to as a "device region." The epilayer may comprise layers for fabricating devices including, but not limited to, photovoltaics, photodiodes, light-emitting diodes, lasers, and field effect transistors, such as metal-semiconductor field-effect-transistors and high-electron-mobility transistors. In some embodiments, the epilayer comprises at least one III-V material.

Figure 11:
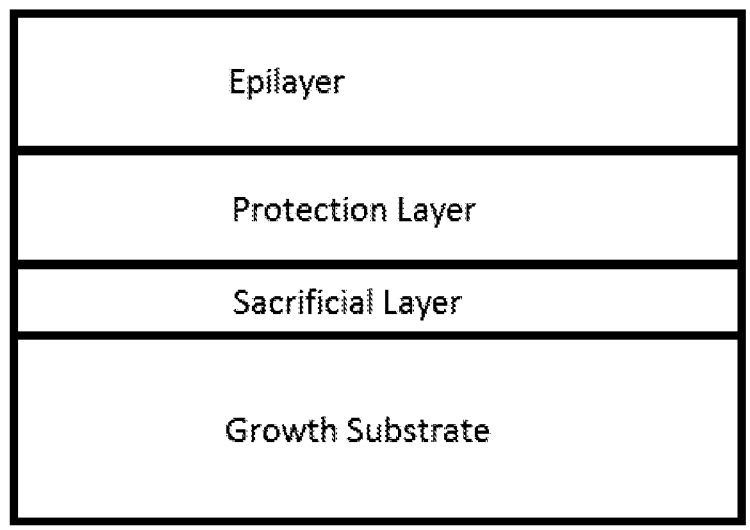
FIG. 11 shows an exemplary growth structure according to the present disclosure.
Figure 12:
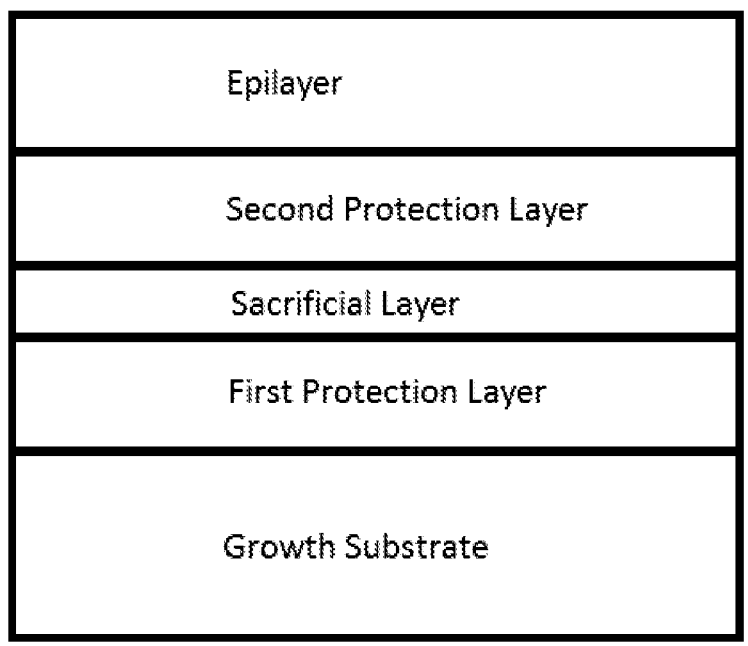
FIG. 12 shows an exemplary growth structure according to the present disclosure.

In another aspect of the present disclosure, the growth structure comprises a protection layer between the sacrificial layer and the epilayer, as shown in FIG. 11. This protection layer is similar to the growth substrate protection layer, except that it serves to protect the epilayer (i.e., the device region) during ELO instead of the growth substrate. The growth structure may comprise a protection layer (first protection layer) between the growth substrate and the sacrificial layer and a protection layer (second protection layer) between the sacrificial layer and the epilayer (FIG. 12). The second protection layer may comprise a superlattice layer as described above, one or more protective layers as described above, or a combination thereof. Therefore, the embodiments described for the first protection layer are also appropriate for the second protection layer, except that it should be understood that the second protection layer may require a reverse orientation.

Figure 13:
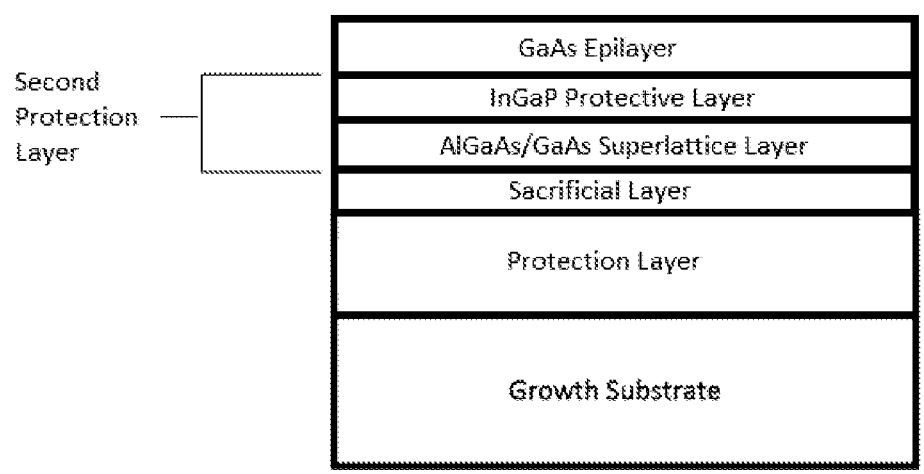
FIG. 13 shows an example of a growth structure with a device protection scheme.

For example, in FIG. 3B, an InGaP protective layer is deposited over a GaAs growth substrate, followed by deposition of an AlGaAs/GaAs superlattice layer, both of which constitute the first protection layer. In FIG. 13, e.g., an AlGaAs/GaAs superlattice layer is first deposited over the sacrificial layer, followed by deposition of an InGaP protective layer, both of which constitute the second protection layer and protect the GaAs device layer during ELO. After ELO, the second protection layer may be etched from the epilayer as described herein for the removal of the first protection layer. It should also be understood that the considerations described herein with respect to the growth substrate material and the selection of appropriate materials for the first protection layer are applicable to the second protection layer, except with respect to the epilayer rather than the growth substrate. For example, after ELO is performed on the structure in FIG. 13, the AlGaAs/GaAs superlattice layer may be removed with a phosphoric acid-based etchant until the etching stops at the InGaP protective layer. The InGaP protective layer may then be removed through etching in diluted HCl (HCl:H$_2$O (1:1), which provides complete etch selectivity with the GaAs epilayer.

Figure 7:
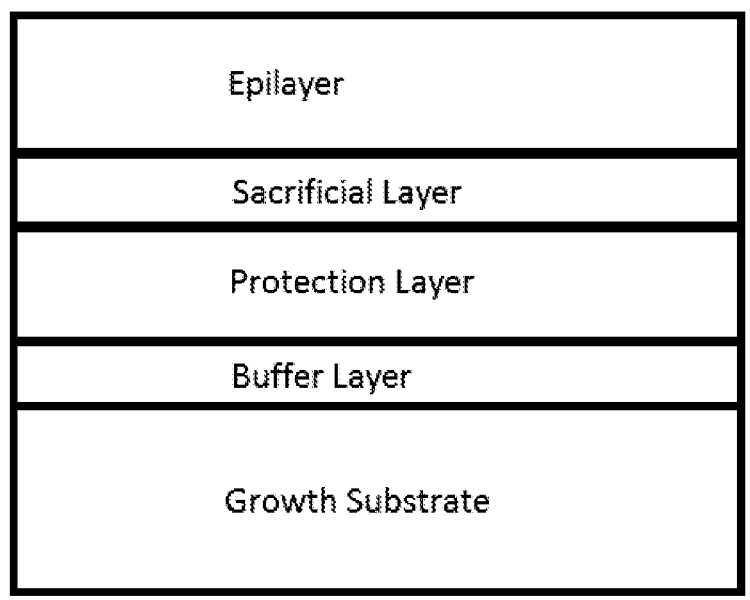
FIG. 7 shows an exemplary growth structure.

As shown in FIG. 7, the growth structure may further comprise a buffer layer. The buffer layer may be positioned between the growth substrate and the protection layer. In some embodiments, the buffer layer is disposed directly on the growing surface of the growth substrate. The buffer layer provides a high quality interface for epitaxial growth and, unlike the protection layer, is not removed from the growth substrate after each regrowth. In some embodiments, the buffer layer and the growth substrate may comprise the same material, such as, for example, GaAs. In some embodiments, the buffer layer comprises a III-V material. In some embodiments, the buffer layer has a thickness in a range from 100 nm to 2 µm.

Figure 8:
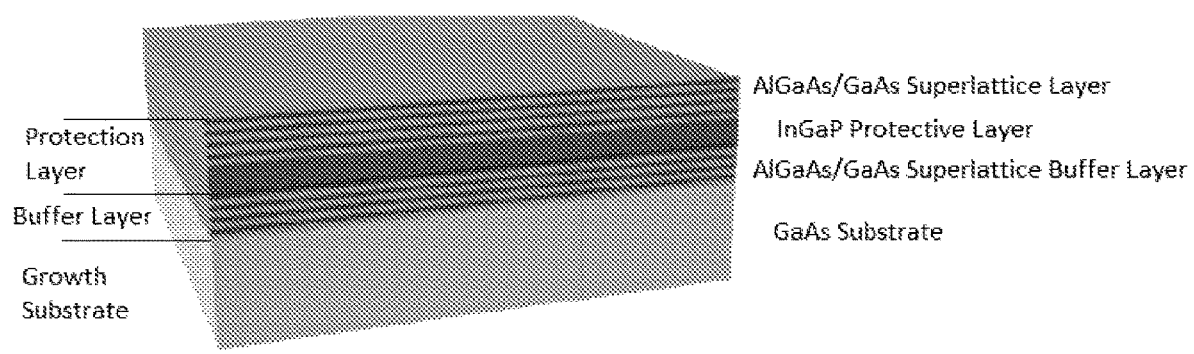
FIG. 8 shows an example of a wafer protection scheme including a superlattice buffer layer.

In some embodiments, the buffer layer is a superlattice buffer layer. FIG. 8 provides an example of a wafer protection scheme where the protection layer comprises a superlattice layer and the buffer layer is a superlattice buffer layer. In some embodiments, the superlattice buffer layer comprises III-V materials, such as, for example, arsenide- or phosphide-based materials. In some embodiments, the superlattice buffer layer and the growth substrate comprise the same material (e.g., a GaAs growth substrate and an AlGaAs/GaAs superlattice buffer layer).

In some embodiments, each individual layer in the superlattice buffer layer has a thickness in a range from 0.5 nm to 300 nm, such as from 1 nm to 100 nm, from 1 nm to 50 nm, or from 2 nm to 25 nm. In some embodiments, the superlattice buffer layer has a total thickness in a range from 2 nm to 2 µm.

In some embodiments, the superlattice buffer layer has at least 2 periods, at least 5 periods, at least 10 periods, at least 25 periods, at least 40 periods, at least 50 periods, at least 100 periods, or any number of periods therebetween. In some embodiments, the superlattice buffer layer has at least 5 but no more than 60 periods. In some embodiments, the superlattice buffer layer has at least 25 but no more than 60 periods.

In certain embodiments, the superlattice buffer layer comprises at least 2 periods, at least 5 periods, at least 10 periods, at least 25 periods, at least 40 periods, at least 50 periods, at least 100 periods, or any number of periods therebetween of AlGaAs/GaAs. In further of these embodiments, the growth substrate comprises GaAs. In certain embodiments, each AlGaAs layer in the superlattice buffer layer has a thickness of 4 nm or less. In certain embodiments, the Al composition in one or more, or in certain embodiments in each, AlGaAs layer ranges from about 1% to about 40%, i.e., from about $Al_{0.01}Ga_{0.99}As/GaAs$ to about $Al_{0.40}Ga_{0.60}As/GaAs$. In certain embodiments, the superlattice buffer layer comprises at least 5 but no more than 60 periods of $Al_{0.3}Ga_{0.7}As/GaAs$.

Figure 9A:
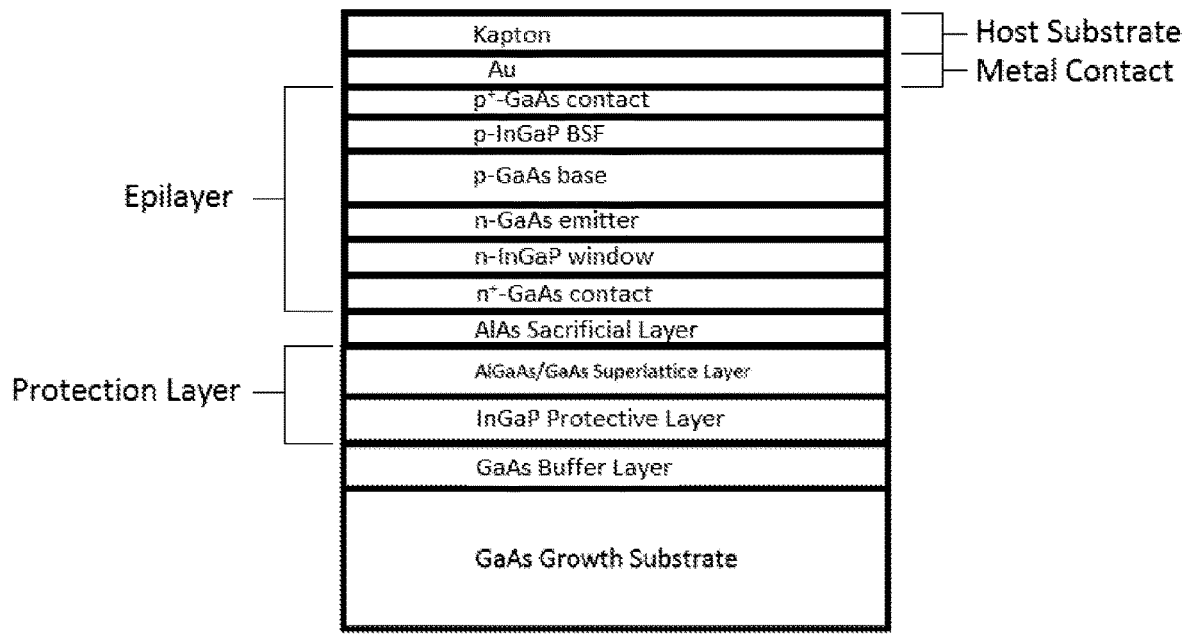
FIG. 9A shows an exemplary growth structure.
Figure 9B:
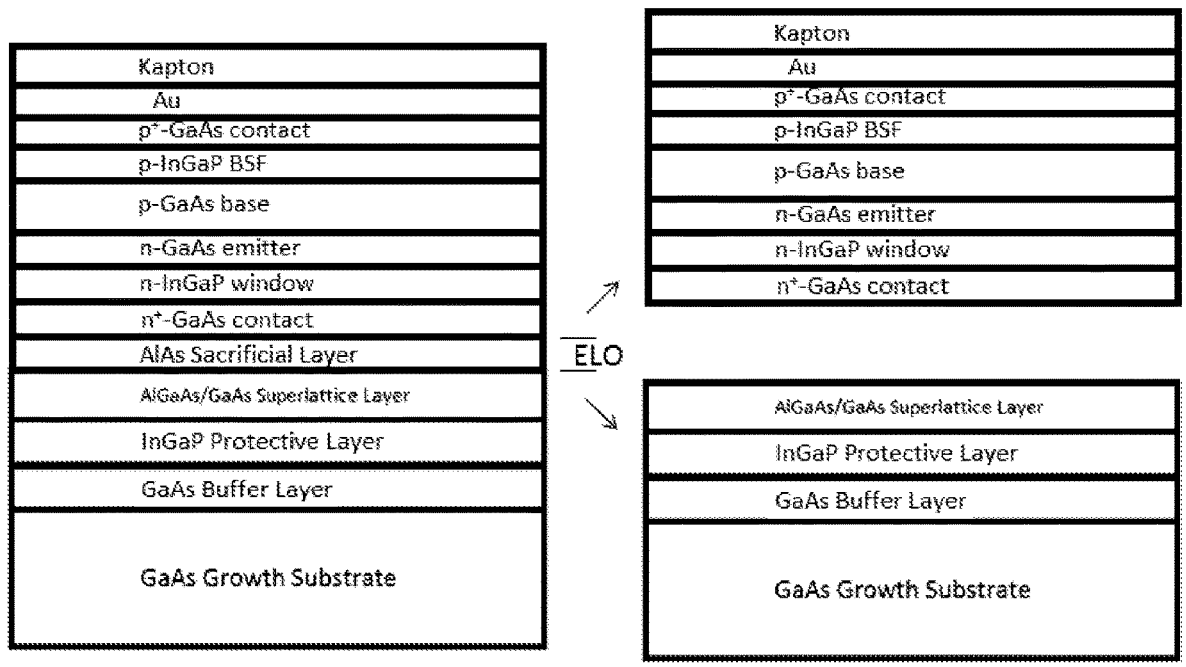
FIG. 9B shows the result of performing ELO on the growth structure of FIG. 9A.

The growth structure may further comprise a metal contact and a host substrate. FIG. 9A provides an exemplary growth structure according to the present disclosure, where the growth structure contains a GaAs growth substrate, a GaAs buffer layer, a protection layer comprising an InGaP protective layer and an AlGaAs/GaAs superlattice layer, an AlAs sacrificial layer, an epilayer forming a solar cell device region, an Au metal contact, and a Kapton host substrate. As shown in FIG. 9B, the ELO process releases the epilayer from the growth substrate, leaving the epilayer disposed on the host substrate and leaving the growth substrate available for recycling. In particular, the superlattice layer and the protective layer may be removed via respective etchings, leaving an "epi-ready" surface for regrowth.

Also disclosed is a method of fabricating a growth structure as described herein. The method of fabricating a growth structure for ELO comprises depositing a protection layer over a growth substrate, depositing a sacrificial layer over the protection layer, and depositing an epilayer over the sacrificial layer, wherein the protection layer comprises at least one superlattice layer. As discussed herein, the protection layer may further comprise one or more protective layers. In some embodiments, the method further comprises depositing a buffer layer over the growth substrate prior to depositing the protection layer. As discussed herein, in certain embodiments, the buffer layer is a superlattice buffer layer.

The method may further comprise depositing a second protection layer over the sacrificial layer prior to depositing the epilayer, such that the second protection layer is disposed between the sacrificial layer and the epilayer. The second protection layer may comprise at least one superlattice layer as described herein, one or more protective layers as described herein, or a combination thereof.

The method may further comprise depositing a metal contact, e.g., gold, over the epilayer. In further embodiments, the method further comprises cold-weld bonding a metal-coated host substrate to the metal contact. In certain embodiments, the host substrate is a metal foil or polymer film. In certain embodiments, the host substrate is a flexible plastic substrate, such as a Kapton® sheet.

Suitable deposition techniques for preparing the growth structure include, but are not limited to, gas source molecular beam epitaxy (GSMBE), metallo-organic chemical vapor deposition (MOCVD), hydride vapor phase epitaxy (HVPE), solid source molecular beam epitaxy (SSMBE), and chemical beam epitaxy.

A further aspect of the present disclosure relates to methods of recycling the growth substrates of the growth structures described herein. In particular, there is disclosed a method of recycling a growth substrate comprising providing a growth structure comprising a growth substrate, a protection layer above the growth substrate, a sacrificial layer above the protection layer, and an epilayer above the sacrificial layer, wherein the protection layer comprises at least one superlattice layer; releasing the epilayer by etching the sacrificial layer; and removing the protection layer by etching the protection layer. Removal of the protection layer provides a high quality surface for regrowth. In some embodiments, as described herein, the protection layer further comprises one or more protective layers. In some embodiments, as discussed herein, the growth structure further comprises a buffer layer between the growth substrate and the protection layer. In certain embodiments, the buffer layer is a superlattice buffer layer, as described herein.

Another aspect of the present disclosure concerns a method of preserving the integrity of a device region during ELO, comprising providing a growth structure comprising a growth substrate, a sacrificial layer above the growth substrate, a protection layer above the sacrificial layer, and an epilayer above the protection layer, wherein the protection layer comprises at least one superlattice layer; releasing the epilayer by etching the sacrificial layer; and removing the protection layer from the epilayer by etching the protection layer. In some embodiments, as described herein, the protection layer further comprises one or more protective layers.

Etching may be performed according to techniques known in the art. Examples include, but are not limited to, wet etching, vapor etching, or dry etching (e.g., plasma etches). Suitable etchants include, but are not limited to, HF, $H_3PO_4$, HCl, $H_2SO_4$, $H_2O_2$, $HNO_3$, $C_6H_8O_7$, and combinations thereof. For example, suitable etchant combinations may include $H_3PO_4$:HCl, $H_2SO_4$:$H_2O_2$:$H_2O$, and HF:$H_2O_2$:$H_2O$.

The sacrificial layer may be etched using an etchant chosen to selectively etch the sacrificial layer. For example, the etch selectivity of the sacrificial layer to the epilayer and/or the growth substrate may be at least about $10^2$:1, such as at least about $10^3$:1, $10^4$:1, $10^5$:1, $10^6$:1, or $10^7$:1. In some embodiments, the sacrificial layer is etched with a wet etchant. In certain embodiments, the wet etchant is HF. In certain embodiments, the wet etchant is HF and the sacrificial layer comprises AlAs. One non-limiting technique is to dip or submerge the growth structure in the etchant.

The step of releasing the sacrificial layer by etching may be combined with other techniques, for example, spalling. PCT Patent Application No. PCT/US14/52642 is incorporated herein by reference for its disclosure of releasing an epilayer via combination of etching and spalling.

In embodiments where the protection layer comprises only the superlattice layer, the protection layer is removed by etching the superlattice layer. The materials for the superlattice layer and the etchant may be chosen such that the superlattice layer has high etch selectivity relative to the growth substrate (and/or relative to the growth substrate buffer layer as the case may be). The etchant should therefore stop cleanly and smoothly at the surface of the growth substrate (or at the surface of the buffer layer as the case may be). These considerations apply to the epilayer protection layer, except with respect to the epilayer instead of the growth substrate.

In some embodiments, the protection layer further comprises one or more protective layers as described herein. In these embodiments, removing the protection layer requires etching each of the protective layers and the superlattice layer, the order of removal varying depending on the layer configuration. The protective layer nearest the growth substrate (or nearest the buffer layer as the case may be) should have high etch selectivity relative to the growth substrate (or relative to the buffer layer as the case may be). If the superlattice layer is nearer to the growth substrate (or nearer to the buffer layer as the case may be) than the protective layer(s) (e.g., FIG. 4B), the superlattice layer should have high etch selectivity relative to the growth substrate (or relative to the buffer layer as the case may be). In some embodiments, the protective layer(s) and the superlattice layer are each independently removed using suitable etchants, such as those described above. These considerations apply to the epilayer protection layer, except with respect to the epilayer instead of the growth substrate.

Adding the one or more protective layers creates more options for providing a smooth regrowth surface after etching the various layers away from the growth substrate and for choosing suitable materials that are grown below (or above as the case may be) the sacrificial layer, allowing for the use of the best available etchant-material combinations for protection during ELO.

For example, using the protection scheme shown in FIG. 3B, the AlGaAs/GaAs superlattice layer may be wet etched with a phosphoric acid-based etchant ($H_3PO_4$:$H_2O_2$:$H_2O$ (3:1:25) until the etching stops at the InGaP protective layer. The InGaP protective layer may then be removed through etching in diluted HCl (HCl:$H_2O$ (1:1), which provides complete etch selectivity with the GaAs growth substrate. This recycling of the growth substrate provides an "epi-ready" high quality regrowth surface.

After multiple iterations of performing ELO and regrowth, the buffer layers, if used, will build in thickness.

Figure 10:
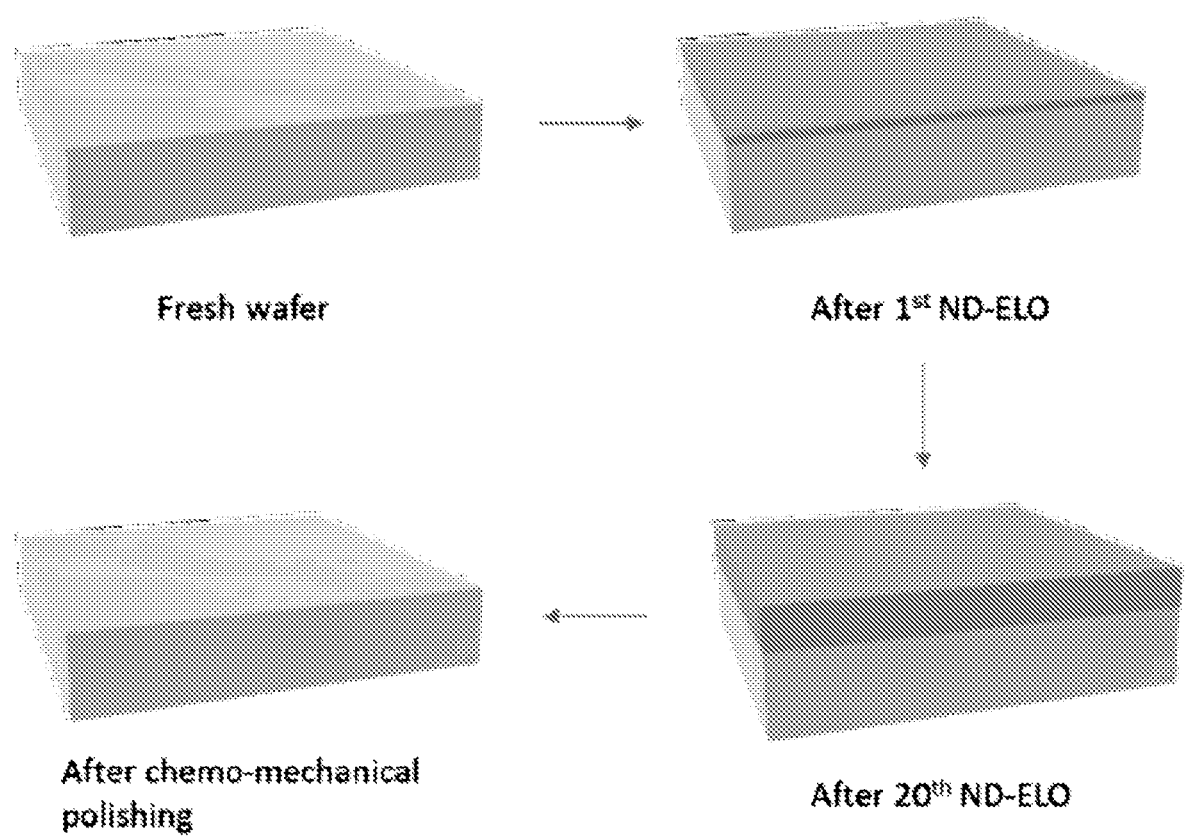
FIG. 10 shows an example of a flow process for polishing off the accumulated buffer layer after several regrowths.

For example, after approximately 20 growths, the accumulated buffer layers may have a total thickness of approximately 10 μm. Chemo-mechanical polishing, for example, may be performed to polish away the accumulated buffer layers, eliminating potential residual roughness and defects while causing little to no thickness loss of the wafer. The result is an epi-ready surface for wafer reuse. FIG. 10 provides a flow diagram of this process.

Thus, there is disclosed a method of recycling a growth substrate, comprising: depositing a buffer layer over a growth substrate, depositing a protection layer over the buffer layer, depositing a sacrificial layer over the protection layer, depositing an epilayer over the sacrificial layer, releasing the epilayer by etching the sacrificial layer, removing the protection layer by etching the protection layer, performing at least one iteration of the above steps, and polishing the growth substrate to remove some or all of an accumulation of the buffer layer. In some embodiments, the polishing step is performed after at least 5 iterations, such as at least 10 iterations, at least 20 iterations, at least 30 iterations, at least 40 iterations, or at least 50 iterations. In some embodiments, the protection layer comprises a superlattice layer, as described herein (and may also comprise one or more protective layers as described herein). In some embodiments, the buffer layer is a superlattice buffer layer, as described herein.

The present disclosure also contemplates embodiments in which the buffer layer is a superlattice buffer layer and the protection layer comprises one or more protective layers, as described herein, but does not comprise a superlattice layer. Thus, there is disclosed a growth structure for ELO comprising a growth substrate, a superlattice buffer layer above the growth substrate, a protection layer above the superlattice buffer layer, a sacrificial layer above the protection layer, and an epilayer above the sacrificial layer, wherein the protection layer comprises one or more protective layers.

Similarly disclosed is a method of fabricating a growth structure for ELO comprising depositing a superlattice buffer layer over a growth substrate, depositing a protection layer over the superlattice buffer layer, depositing a sacrificial layer over the protection layer, and depositing an epilayer over the sacrificial layer, wherein the protection layer comprises one or more protective layers.

There is similarly disclosed a method of recycling a growth substrate comprising providing a growth structure comprising a growth substrate, a superlattice buffer layer above the growth substrate, a protection layer above the superlattice buffer layer, a sacrificial layer above the protection layer, and an epilayer above the sacrificial layer, wherein the protection layer comprises one or more protective layers; releasing the epilayer by etching the sacrificial layer; and removing the protection layer by etching the protection layer.

Other embodiments of the devices and methods described herein will be apparent to those skilled in the art from consideration of the specification and practice. It is intended that the specification be considered as exemplary only, with the true scope of the devices and methods described being indicated by the claims.

What is claimed is:

1. A growth structure for epitaxial lift-off, comprising:
   a growth substrate;
   a protection layer above the growth substrate;
   a sacrificial layer above the protection layer; and
   an epilayer above the sacrificial layer,
   wherein the growth substrate comprises GaAs;
   wherein the protection layer comprises at least one superlattice layer, wherein each period of the superlattice layer comprises a material combination chosen from AlGaAs/GaAs, GaAsP/GaAs, InGaAs/GaAs, AlGaAs/AlGaAs, InGaP/InAlGaP, InAlGaP/GaAs, and InGaP/GaAs; and
   wherein the sacrificial layer comprises AlAs.

2. The growth structure of claim 1, wherein the superlattice contains at least 5 but no more than 60 periods.

3. The growth structure of claim 1, wherein the protection layer further comprises one or more protective layers.

4. The growth structure of claim 3, wherein the one or more protective layers are positioned between the growth substrate and the superlattice layer.

5. The growth structure of claim 4, wherein the one or more protective layers comprises InGaP.

6. The growth structure of claim 5, wherein the at least one superlattice layer comprises at least 5 but no more than 60 periods of AlGaAs/GaAs.

7. The growth structure of claim 1, further comprising a buffer layer between the growth substrate and the protection layer.

8. The growth structure of claim 7, wherein the buffer layer comprises GaAs.

9. The growth structure of claim 7, wherein the buffer layer is a superlattice buffer layer.

10. The growth structure of claim 8, wherein the buffer layer comprises a superlattice buffer layer, and wherein each period of the superlattice buffer layer comprises AlGaAs/GaAs.

11. The growth structure of claim 10, wherein each AlGaAs layer in the superlattice buffer layer has a thickness of 4 nm or less.

12. The growth structure of claim 10, wherein each AlGaAs layer in the superlattice buffer layer has an Al composition in the range of about $Al_{0.01}Ga_{0.99}As/GaAs$ to about $Al_{0.40}Ga_{0.60}As/GaAs$.

13. The growth structure of claim 1, wherein the sacrificial layer is a superlattice sacrificial layer.

14. The growth structure of claim 1, wherein the epilayer comprises active semiconductor layers for forming a photovoltaic device.

15. The growth structure of claim 1, further comprising a second protection layer located between the sacrificial layer and the epilayer.

16. The growth structure of claim 15, wherein the second protection layer comprises at least one superlattice layer.

17. The growth structure of claim 3, wherein the one or more protective layers are positioned between the superlattice layer and the sacrificial layer.

18. The growth structure of claim 17, wherein the one or more protective layers comprises GaAs.

19. The growth structure of claim 18, wherein each period of the superlattice layer comprises InGaP/InAlGaP.

20. The growth structure of claim 4, wherein the one or more protective layers comprises InAlP.

* * * * *